United States Patent
Il'Yashenko et al.

(10) Patent No.: US 6,288,980 B1
(45) Date of Patent: *Sep. 11, 2001

(54) MAGNETO-OPTICAL HEAD FOR INFORMATION READING

(75) Inventors: Eugene Ivanovitch Il'Yashenko, Moscow; Valentina Prokofiena Klin, Kaluga; Alexander Gennadievicj Soloviev, Moscow, all of (RU)

(73) Assignee: Garnetec Ltd., Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 09/397,622

(22) Filed: Sep. 16, 1999

Related U.S. Application Data

(63) Continuation of application No. 08/842,287, filed on Apr. 23, 1997, now Pat. No. 6,044,045.

(30) Foreign Application Priority Data

Apr. 23, 1996 (RU) .................................................. 96107470

(51) Int. Cl.⁷ ........................................................ G11B 11/00
(52) U.S. Cl. ................................................. 369/13; 369/14
(58) Field of Search .............................. 369/13, 14, 110, 369/112, 116; 360/114, 59

(56) References Cited

U.S. PATENT DOCUMENTS

| | | | |
|---|---|---|---|
| 3,594,064 | * 7/1971 | Bierlein et al. | 365/122 |
| 3,650,601 | * 3/1972 | Bierlein | 365/122 |
| 5,235,570 | * 8/1993 | Kurtz et al. | 369/13 |
| 5,392,181 | * 2/1995 | Lhureau et al. | 360/114 |

* cited by examiner

*Primary Examiner*—Tan Dinh
(74) *Attorney, Agent, or Firm*—Michael A. Glenn

(57) ABSTRACT

The invention relates to the devices for reading the information from magnetic carriers of recording, more detailed, to magneto-optical heads for reproducing the information. The technical result is substantiated in higher resolution, increase of ratio of useful signal to noise, simplification of construction and manufacturing process of the head, extending the service life. Magneto-optical head for reproducing of information consists of underlay 2 made of material characterized by high transparency in the spectral range of the source of the reading polarized light, for example, from a mono-crystalline gadolinium-gallium garnet. On the side of the underlay 2, that is turned towards magnetic medium 4 with the stored information, a magneto-optical transducer 3 is placed in form of a ferrite-garnet film, on the free side of which a reflective mirror layer 6 can be deposited. The opposite side of the underlay 2 in the fragments 11 and 12 lying in the propagation way of the reading light beam, the one entering the underlay 2, as well as the one reflected from film 3, is made convex, with a curvature assuring possibility of enlargement of the domain structure image of the ferrite-garnet film 3. Additionally, the curvatures of the convex fragments 11 and 12 may be different.

5 Claims, 2 Drawing Sheets

MAGNETO-OPTICAL HEAD FOR INFORMATION READING

Figure 1:
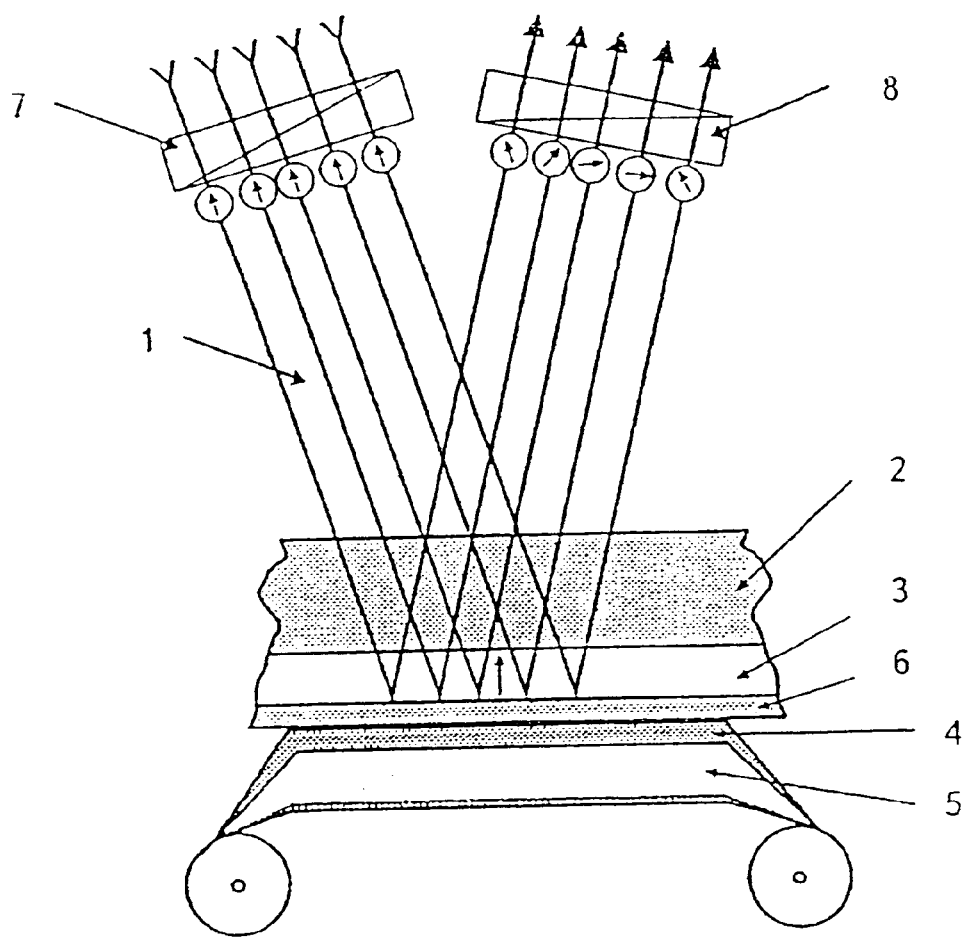

This is a continuation application of Ser. No. 08/842,287, filed on Apr. 23, 1997 and now is U.S. Pat. No. 6,044,045.

BACKGROUND OF THE INVENTION

The invention relates to the devices for information reading, in particular, from magnetic media of recording and information storage and may be utilized for building magneto-optical heads for information reading.

Known is a head for recording/reproduction of information, containing deposed on an underlay first film of a magnetic material, a film of a non-magnetic material, second film of a magnetic material, and on one side of the head various layers lie in one plane; this side, which becomes the active surface of the head, relative to which moves a magnetic carrier storing information, is covered with a film of a material having zones with various properties, in particular, guard (uprotchnyashtchye) zones (see U.S. Pat. No. 4,897,747, Key No. 360/122, MPK G11B 5/187, 1990). In a particular variant of implementation a thin-film magnetic head of this type contains an underlay, which consists of an aluminum film deposited on a ceramic plate; first film of a magnetic material covered by a film of a non-magnetic material; flat winding embracing the magnetic film; second film of magnetic material isolated from the winding and bound to the first magnetic film. The two magnetic films are in contact with each other in the center of the winding, they have a common zone for passing magnetic flux and a separated by a layer of a non-magnetic material forming the magnetic head gap.

Heads of this type, qualified as inductive heads, are practically difficult to utilize at high and very high densities of information, since the distance between poles of the head has to be finite and its reduction leads to reduced level of useful output signal. In result, with passage to the very high densities the value of useful signal (carrier)/noise ratio sharply drops. Besides, manufacturing of multi-track inductive heads, suitable for simultaneous reading of information from multiple recorded in parallel tracks, appears to be an unusually complex and up to now not finally solved problem.

Known are reproducing heads based on huge magneto-resistive effect (see, for example, Process Complexity of Magneto-resistive Sensors: a Review. R. E. Fontana, Jr. IBM Research Division, The International Magnetics Conference, 1995 DIGESTS of INTERMAG'95, Apr. 18–21, 1995, San Antonio, Tex., USA, pp AA-02). Such a head contains a multi-layer sensitive element, placed between shields and separated from them by two conduction layers. The sensitive element itself is a multi-layer film, consisting of alternating magnetic and conducting layers.

The main disadvantage of the reproducing heads based on the huge magneto-resistive effect is related to the fact, that mass production of such heads required extremely high (nanometric) precision technology, resulting in low yield and high price of such heads. Besides, with the nanometric (and more precisely, sub-nanometric) technology it becomes a very serious problem to produce heads with matching parameters and their utilization in assemblies for multi-track reproduction of information. It is suffident to point, that in such heads the thickness of the most critical intermediate non-magnetic layer should not vary more than in the range of +−3 Angstroms, with the absolute values of the order of 20 Angstroms. Currently, after more than four years of intensive experiments, it is still impossible to run serial manufacturng of such heads.

There is also a known magneto-optical reproducing head, which may be utilized for a multi-track reproduction, containing a magneto-optical transducer deposited on an underlay, for instance, in form of a thin epitaxially grown layer of ferrite-garnet, which has at least two pole tips made of that magnetic material, separated by a narrow air gap (see U.S. Pat. No. 5,227,938, Key No. 360/114, MPK G11B 5/127, 1993). The transducer, as well as the pole tips, are formed by means of thin-film technology. The material of the magneto-optical transducer exihibits mono-axial (perpendicular to the film plane) anisotropy and appears to form a single domain at least within the area of a single pole tip.

Among the disadvantages of this particular reproduction head one can reckon a low resolution and insufficient sensitivity, which is related to the mono-axial magnetization of the applied magnetic material.

Known is a reproducing head, in its technical essence and that has achieved results closest to the subject of this invention, suitable for a multi-track reproduction, consisting of underlay made of material with a high refraction coefficient, on which deposited are layers of magnetic material separated by a gap: the first-one, active, less than 500 Angstrom thick, made of a soft magnetic material with high saturation magnetization, with magnetization occurring in the plane of the film, and second layer, of greater thickness for shielding and raising the sensitivity (see F. Maurice. Towards the Multitrack Digital Video Tape Recorder. Proceedings of Magneto-Optical Recording International Symposium '91, J. Magn. Soc. Jpn., Vol. 15, Supplement No. S1 (1991), pp 389–394). Magnetic flux, developed by the magnetic carrier of information, is induced in the magnetic structure of the head and is detected using magneto-optical Kerr effect, i.e. based on the rotation of polarization vector of the reading light beam, formed by a laser source. The beam reflected from the active layer of the head is focused on a photo-receiver device, for instance, on a charge coupled device (CCD) which analyses all tracks of recording in parallel. Output represents the time-multiplexed signal.

Low value of the useful signal/noise ratio is to be considered a disadvantage of this known solution, caused by the fact that the rotation angle of the polarized light vector, which is the essential parameter determining the useful signal, is of the order of 0.35 deg. with typically used light wavelengths (650–700 nm) and magnetic fields generated by magnetic carriers of information. Additionally, for the multi-track mode of reproduction with this particular known head significant inter-track disturbances are typical, caused by the fact, that reading surface of the sensitive element of the magneto-optical transducer is either poly-crystalline or amorphous. Another disadvantage of this particular known reproducing head is the poor repeatability of magnetic and magneto-optical properties of the very thin films of the material used for construction the sensitive element, for which usually sendust (Fe, Al, Si alloy) is used. Besides, imperfection of the optical channel, providing detection of the used signal, does not allow to obtain high sensitivity of said head. Magnetic noise of the area illuminated by the reading light beam, caused by Berkhausen steps effect, leads to an additional reduction of the signal/noise ratio.

SUMMARY OF THE INVENTION

The goal of the invention is a construction of magneto-optical reproducing head which doesn't have the disadvantages characterzing the presented above devices known in the previous level of technology. Technical results achievable thanks to the invention are increased resolution, higher ratio of useful signal to noise, simpler construction of the magneto-optical transducer and of a multi-track reproducing head, and extending its service life without adding complexity of construction. The desired technical result is obtained by the arrangement, in which a magneto-optical head for reproducing information consists of an underlay with a flat surface directed towards magnetic carrier of information, on which a thin-film magneto-optical transducer is placed, according to the invention, the surface of the underlay, which is opposite to the said flat surface, is made convex in the area fragments lying in the way of the incident and reflected reading light beam, and the thin-film magneto-optical transducer is formed of a mono-crystalline magnetic material sensitive to external magnetic field, transparent in the spectral range of the source of the reading light beam, and the convex fragments of the underlay can differ from each other in their radiuses of curvature.

A material with refraction coefficient greater or equal 1.95 is preferably chosen as the underlay material.

Additionally, the preferred choice of material for the thin-film magneto-optical transducer is a mono-crystalline ferrite having garnet structure, on a free surface of which a thin layer of a material with high value of reflection coefficient can be deposited, the reflecting material can chosen from the group consisting of aluminum, silver, gold, chromium and their alloys.

DRAWINGS

Figure 2:
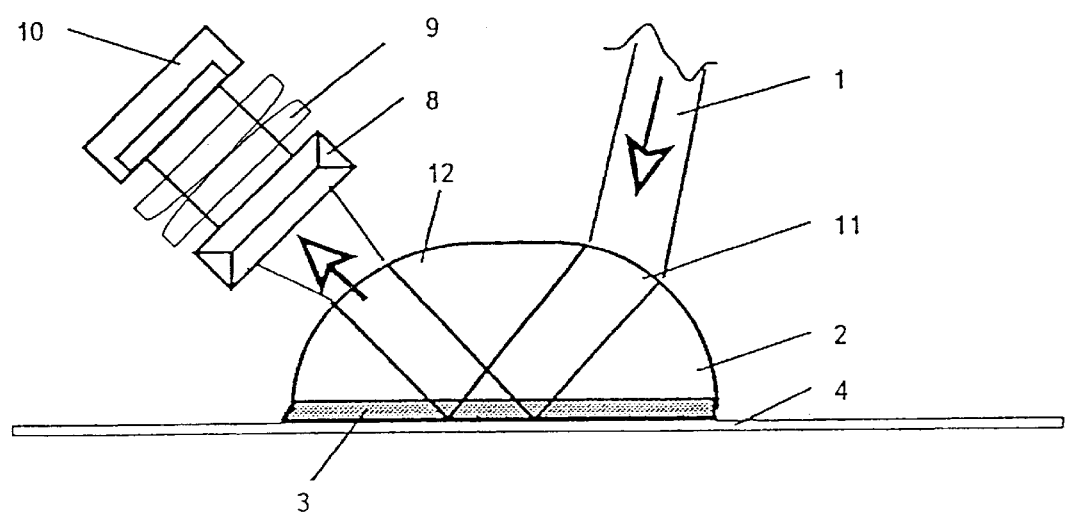

The invention is explained by examples of its embodiment, illustrated by diagrams, presenting the following:

FIG. 1 is a schematic presentation of a device for reading information from a magnetic medium, in which a reproducing head according to the invention may be utilized; and FIG. 2 is a schematic presentation of a magneto-optical reproducing head according to the invention.

DETAILED DESCRIPTION

The device for magneto-optical reproduction from a magnetic carrier of information consists of a source of a polarized light, for example a laser diode (not shown on the diagrams), placed so that it is possible to direct the beam of polarized light 1 towards the underlay 2, which is made of material having high transparency in the spectral range of the used source of polarized light. The surface of one side of the underlay 2 is flat and a magneto-optical transducer is placed on it, the transducer is made in form of a thin ferrite-garnet film 3, the magnetization vector of which can have any orientation relative to the said flat surface of the underlay 2. The film 3 acts as an element sensitive to external magnetic fields, its surface can be oriented in any direction relative to the magnetic carrier of information being read, the carrier consisting of magnetic medium 4 carrying the stored information and the base film 5. The ferrite-garnet film 3 can be deposited on the underlay in various ways, for instance, by way of liquid phase epitaxy, sputtering or pyrolysis. A thin-film coating 6 of a material with high reflection coefficient, for instance, aluminum, silver, gold, chromium, etc. is deposited on the surface of film 3 which directed towards the magnetic medium 4 carrying the stored information. The device for magneto-optical reading of information also contains polarizer 7, analyzer 8, forming optical system 9, and receiving matrix of light sensors, which may be either single-dimension or two-dimension.

As shown on FIG. 2, magneto-optical reproducing head, according to the invention, consists of an underlay 2 made of a material characterized by a high transparency in the spectral range of the source of the reading polarized light, for instance, of a mono-crystalhline gadolinium-gallium garnet (GGG), GGG doped with Ca, Mg, Zr, or gadolinium-scandium-gallium garnet (GSGG). On the side of the underlay which is directed towards magnetic medium 4 carrying the stored information, a magneto-optical transducer is placed, having form of a ferrite-garnet film 3, which has a given crystallographic orientation, for instance [100] or [210]. A mirror reflecting layer 6 (FIG. 1) can be deposited on the free side of the ferrite-garnet film 3, necessity of which is determined taking in consideration reflecting properties of the information carrier being read.

On the opposite side of the underlay 2 within its fragments 11 and 12, on the propagation way of the reading beam, at the entrance into the transparent environment of the underlay, as well as at the exit of the beam reflected from the film 3 of the magneto-optical transducer, is not flat. More precisely, it is convex with a curvature allowing for enlargement of the image of the domain structure of the ferrite-garnet film, and the curvature of the convex fragment 11 at the entrance of the light beam into the underlay 2 from the curvature of the convex fragment 12 at the exit of the light beam from the underlay 2. The curvatures of both convex fragments 11 and 12 of the underlay 2 is determined by combination of optical parameters of the underlay 2, distance to the matrix 10 of the elements detecting the reflected light beam (CCD), by requirements regarding geometric characteristics of the reproducing head, including the initial thickness of the underlay material, parameters of the used source of polarized light and its distance from the underlay 2.

Magneto-optical reproducing head, according to the invention, operates as follows.

The reading beam 1 from the source of polarized light is directed towards the underlay 2 (fragment 11), goes through it and hits the ferrite-garnet film 3 sensitive to the external magnetic fields, which is positioned in direct proximity of the magnetic medium 4 carrying the recorded information, the beam is focused on the fragment of the magnetic medium-carrier being read. Going through the ferrite-garnet film 3 the polarization vector of the light beam is subjected to the Faraday rotation, magnitude and direction of which depend on the position of the magnetization vector of the ferrite-garnet film 3, which, in turn, is determined by the magnitude and direction of the external magnetic field, i.e. magnetic field of the information carrier. Reflecting from the magnetic medium 4 of the information carrier or from the thin-film mirror layer 6 (FIG. 1) specially deposited on the open surface of the ferrite-garnet film 3, the polarized light passes the second time through the ferrite-garnet film 3, and its polarization vector is subjected one more time to the Faraday rotation dependent on the magnitude and direction of the magnetization vector of the ferrite-garnet film 3. The reflected beam goes through the fragment of the underlay 2, having convex surface, forming an enlarged image of the domain structure of the ferrite-garnet film on the analyzer 8. The position of the polarization angle of the analyzer 8 is adjusted in such a manner, that it passes through the useful output optical signal having a predetermined direction of its polarization vector. This optical signal falls through the optical system 9 on the light-sensitive matrix 10, which in response to the information read from the magnetic carrier and contained in the received optical signal forms an electric signal which is sent into the output channel of the reproducing head.

At the same time, thanks to using the underlay material with a high value of refraction coefficient (n>1.95), such as GGG, GGG doped with Ca, Mg, Zr, etc., as compared to known underlays made of amorphous materials, for instance, of glass, high values of image enlargement can be achieved at smaller values of surface curvature of the underlay 2, responsible for forming the input/output optical channel.

In one of the substantial examples of the invention embodiment, the magneto-optical transducer was implemented as a ferrite-garnet film with magnetization vector lying in the film plane. Study of dynamic properties of the head, carried by the inventors, has shown that the delay of reorientation of domain structure of the magneto-optical transducer did not exceed 300 ps ($3*10^{-10}$ sec). This allows for processing of the changes of the domain structure without any significant delay, assuring high speed operation of the information reading channel (more than 1 GHz).

Forming a magneto-optical head according to the invention assures following advantages.

Integration in one construction node of the sensitive layer on one side of the underlay and the convex fragments on its other side guarantees adequate beam focusing and optical enlargement of reproduced information, substantially increasing resolution and reducing losses of light thanks to the absence of additional surfaces which the optical beam would have to pass going between the environments in which it propagates; these losses are impossible to avoid in other well known solutions.

Using the underlay material with high value of the refraction coefficient assures achieving the required enlargement of the image at smaller curvatures of the convex fragments of the underlay and allows for simplification of the manufacturing of the magneto-optical head.

Using the magneto-optical Faraday effect in the disclosed head assures deeper optical modulation at given values of external magnetic fields as compared to magnetic Kerr effect in known constructions of heads, leads to substantial increase of the ratio between useful signal and noise.

Forming of a magneto-optical transducer from a monocrystalline material, having a uniform crystalline structure, removes the main cause of crosstalk disturbances in a magneto-optical head construction working in a multi-track reproduction mode.

What is claimed is:

1. A magneto-optical head for reproducing information recorded on a magnetic carrier, the magneto-optical head forming a propagation path for an incident polarized optical beam provided by a polarized optical beam source and for a reflected polarized optical beam whose polarized has been altered by magnetic fields from the magnetic carrier, the head comprising:

an underlay member that is transparent in the spectral range that permits the passage of the optical beam, the underlay member has opposite surfaces positioned in the propagation path for the incident and the reflected polarized optical beams, one of the surfaces is flat and faces the magnetic carrier when the magneto-optical head is positioned for reproducing information, the other of the opposite surfaces has fragments that curve convexly outward from the flat surface and that are positioned in the propagation path for the incident and the reflected polarized optical beams; and a thin-film magneto-optical transducer of monocrystalline magnetic material that is transparent in the spectral range that permits passage of the optical beam and sensitive to an external magnetic field to alter the polarization of optical beams passing through the transducer, the transducer is positioned in the propagation path for incident and reflected polarized optical beams between the flat surface of the underlay member and an optically reflective surface of a body that directs the reflected polarized optical beam along the propagation path so that the transducer intercepts magnetic fields from the magnetic carrier when the magneto-optical head is positioned for reproducing information.

2. The magneto-optical head according to claim 1 wherein the body having optically reflective surface is a layer of material located on a surface of the transducer that faces the magnetic carrier when the magneto-optical head is positioned for reproducing information, the layer of material is located with the optically reflective surface facing the transducer.

3. The magneto-optical head according to claim 1 wherein the underlay member has a first convexly curved surface positioned in the propagation path for directing the incident polarized optical beam and a second convexly curved surface positioned in the propagation path for directing the reflected polarized optical beam, the first and second convexly curved surfaces having different radiuses of curvature.

4. The magneto-optical head according to claim 1 wherein the underlay member is of material having a refraction coefficient that is equal to or greater than 1.95.

5. The magneto-optical head according to claim 1 wherein the body having the optically reflective surface is a layer of material located on a surface of the transducer that faces the magnetic carrier when the magneto-optical head is positioned for reproducing information, the layer of material is located with the optically reflective surface facing the transducer.

* * * * *

UNITED STATES PATENT AND TRADEMARK OFFICE
CERTIFICATE OF CORRECTION

PATENT NO.    : 6,288,980 B1
DATED         : September 11, 2001
INVENTOR(S)   : Il' Yashenko et al.

It is certified that error appears in the above-identified patent and that said Letters Patent is hereby corrected as shown below:

Title page,
Item [73], Assignee, replace "Garnetec, Ltd. Dublin, Ireland" with -- Garnetec, Ltd. Thatcham, Berkshire, UK --.

Signed and Sealed this

Fourth Day of January, 2005

JON W. DUDAS
*Director of the United States Patent and Trademark Office*